US011901164B2

(12) United States Patent
Whiting et al.

(10) Patent No.: US 11,901,164 B2
(45) Date of Patent: Feb. 13, 2024

(54) MICRO-SURFACE MORPHOLOGICAL MATCHING FOR REACTOR COMPONENTS

(71) Applicant: Intel Corporation, Santa Clara, CA (US)

(72) Inventors: Patrick Whiting, Beaverton, OR (US); Jeffrey L. Young, San Francisco, CA (US); Ryan Wood, Portland, OR (US); Eric Scott, Hillsboro, OR (US); David Laube, Mesa, AZ (US); Alex Collins, Lebanon, OR (US)

(73) Assignee: Intel Corporation, Santa Clara, CA (US)

( * ) Notice: Subject to any disclaimer, the term of this patent is extended or adjusted under 35 U.S.C. 154(b) by 175 days.

(21) Appl. No.: 17/493,705

(22) Filed: Oct. 4, 2021

(65) Prior Publication Data

US 2022/0028668 A1    Jan. 27, 2022

Related U.S. Application Data

(62) Division of application No. 15/922,762, filed on Mar. 15, 2018, now Pat. No. 11,139,151.

(51) Int. Cl.
*H01J 37/32* (2006.01)
*H01L 21/3065* (2006.01)
*B08B 7/00* (2006.01)

(52) U.S. Cl.
CPC ...... *H01J 37/32853* (2013.01); *B08B 7/0028* (2013.01); *H01L 21/3065* (2013.01); *H01J 2237/334* (2013.01)

(58) Field of Classification Search
None
See application file for complete search history.

(56) References Cited

U.S. PATENT DOCUMENTS 5,401,319 A * 3/1995 Banholzer ......... H01J 37/32458
451/39
5,916,454 A * 6/1999 Richardson ........... H01J 37/321
118/723 R (Continued)

FOREIGN PATENT DOCUMENTS

EP    2747126 A1 * 6/2014 ............. C23C 14/48

OTHER PUBLICATIONS

Final Office Action from U.S. Appl. No. 15/922,762 dated Mar. 29, 2021, 11 pgs.

(Continued)

*Primary Examiner* — Allan W. Olsen
(74) *Attorney, Agent, or Firm* — Essential Patents Group, LLP

(57) ABSTRACT

A method is disclosed, which comprises estimating a first value of a parameter of a component, prior to a use of the component in a reactor. In an example, the parameter of the component is to change during the use of the component in the reactor. The component may be treated, subsequent to the use of the component in the reactor. A second value of the parameter of the component may be estimated, subsequent to treating the component. The second value may be compared with the first value, where a reuse of the component in the reactor is to occur in response to the second value being within a threshold range of the first value.

20 Claims, 6 Drawing Sheets

(56) References Cited

U.S. PATENT DOCUMENTS

| | | | | |
|---|---|---|---|---|
| 6,030,514 | A * | 2/2000 | Dunlop | C23C 14/3414 216/75 |
| 6,805,952 | B2 * | 10/2004 | Chang | C23C 4/10 428/335 |
| 7,176,140 | B1 * | 2/2007 | Rivkin | H01L 21/02057 134/1 |
| 7,300,537 | B2 * | 11/2007 | O'Donnell | H01J 37/3255 118/724 |
| 7,541,094 | B1 * | 6/2009 | Zuck | H01L 21/67069 216/88 |
| 2003/0091835 | A1 * | 5/2003 | Takahashi | C03C 17/007 428/432 |
| 2007/0178810 | A1 * | 8/2007 | Choi | B24C 3/322 451/38 |
| 2012/0255635 | A1 * | 10/2012 | Banda | B24B 37/107 156/701 |

OTHER PUBLICATIONS

Non-Final Office Action from U.S. Appl. No. 15/922,762 dated Oct. 7, 2020, 8 pgs.
Restriction Requirement from U.S. Appl. No. 15/922,762 dated Jan. 27, 2020, 6 pgs.
Restriction Requirement from U.S. Appl. No. 15/922,762 dated May 27, 2020, 6 pgs.
Notice of Allowance from U.S. Appl. No. 15/922,762 dated Jun. 9, 2021, 8 pgs.

* cited by examiner

MICRO-SURFACE MORPHOLOGICAL MATCHING FOR REACTOR COMPONENTS

CLAIM OF PRIORITY

This application is a divisional of, and claims the benefit of priority to, U.S. patent application Ser. No. 15/922,762, filed on Mar. 15, 2018 and titled "MICRO-SURFACE MORPHOLOGICAL MATCHING FOR REACTOR COMPONENTS," which is incorporated by reference in entirety.

BACKGROUND

Microelectronic devices are often etched within a reactor, such as a vacuum dry etch reactor. A reactor may utilize radicals generated, for example, by remote plasma sources. The radicals may not only will react with the intended targets (e.g., silicon wafers and associated topography of the target microelectronic devices), but may also react with the secondary surfaces in the surrounding environment (e.g., reactor chamber components).

As the radicals react with the reactor chamber components, chemical buildup may occur on the reactor chamber components, which may necessitate cleaning the reactor chamber components. However, cleaning a reactor chamber component may change a morphology of a surface of the reactor chamber component, e.g., compared to the morphology of the surface when the reactor component was new. Such changes in the surface may change a rate of interaction of the reactor chamber component with the radicals, which may also affect a rate with which the radicals etch the target microelectronic devices.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
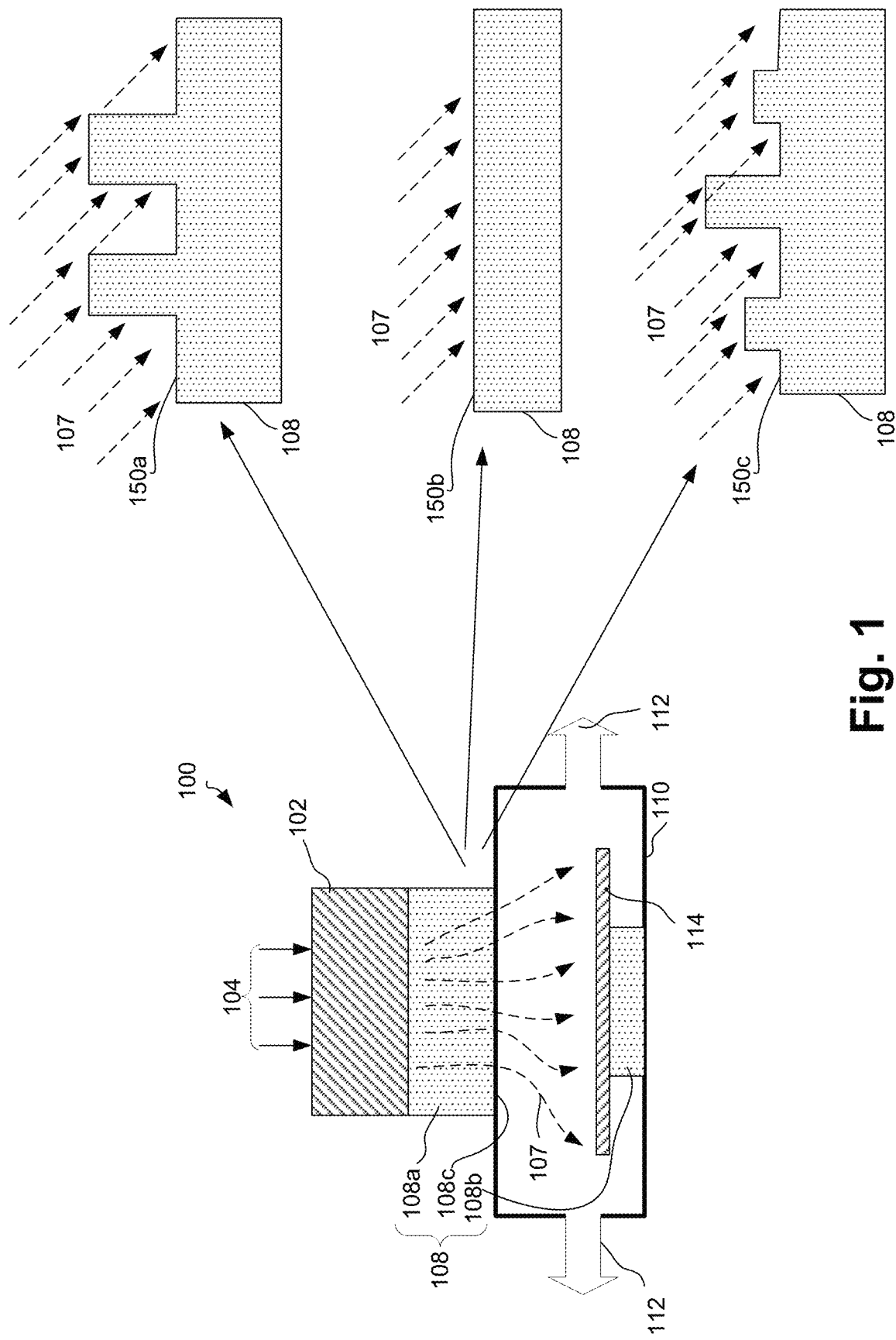
FIG. 1 schematically illustrates a reactor system, where a surface morphology of a reactor chamber component changes with usage and where the reactor chamber component is to be treated to substantially restore its original surface morphology, according to some embodiments.

In a reactor, a component may contact with the etchant gases and radicals. If the component has bare metal surfaces (e.g., surfaces not coated with non-reactive coatings), chemical buildup may occur on the surfaces due to the reaction with the etchant gases and radicals. Over time, the buildup may be substantial, which may require cleaning the component.

In some embodiments, the etching process may be calibrated for a new condition of the component. For example, the new component may have specific surface areas, which may be taken into account while calibrating the etching process. However, after cleaning the component, the surface area of the cleaned component may change with respect to the surface area of the component in new condition. Such a change in the surface area may change the rate of reaction of the component with the etchant gases and radicals, and hence, may also affect the etching process of the target microelectronic devices, which may be undesirable.

Accordingly, in some embodiments, the cleaning of the component may be performed such that the cleaned component has substantially similar surface area as compared to the surface area of the component in new condition. For example, the surface area of the cleaned component may be altered in a controlled manner to morphologically match with the surface area of the component in new condition. Such matching may ensure that the cleaning process does not affect the rate of interaction of the component with etchant gases and radicals, and hence, also does not affect the etch rate of the target microelectronic devices. This may allow repeated reuse or refurbishment of the same component over and over, e.g., instead of having to buy a new component each time the older one has chemical buildup thereon. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1 schematically illustrates a reactor system 100 (also referred to as reactor 100), where a surface morphology of a reactor chamber component changes with usage and where the reactor chamber component is to be treated to substantially restore corresponding original surface morphology, according to some embodiments.

In an example, the reactor 100 may be any appropriate reactor for etching microelectronics devices, such as a vacuum dry etch reactor, a reactor for dry etching (e.g., along with vacuum treatment), etc. The principles of this disclosure may be applied to any appropriate type of reactors that uses etchant radical gases and/or plasma for etching. Various components of the reactor 100 are symbolically illustrated in FIG. 1, without illustrating the exact shape, size, location or details of the reactor components, for ease of discussion.

In some embodiments, a plasma generator 102 of the reactor 100 receives gases 104, such as Nitrogen trifluoride (NF3), Helium (He), Hydrogen (H), and/or any other appropriate type of gas. The plasma generator 102 generates plasma or radicals 107, flow of which are symbolically illustrated by dotted lines. The plasma or radicals 107 at least in part form the etchant gases for etching a target microelectronic device 114. The radicals 107 flow through an inlet 108a, and to a reactor chamber 110. In FIG. 1, an inner surface of the chamber 110 is referred to using label 108c. The target microelectronic device 114 is placed on a chuck 108b. The radicals 107 interact with the microelectronic device 114 to selectively etch at least one or more sections of the microelectronic device 114. The radicals 107 exit through exhausts 112.

As previously alluded herein, various components of the reactor 100 are symbolically illustrated in FIG. 1, without illustrating the exact shape, size, location or details of the reactor components, for ease of discussion. For example, although not illustrated in FIG. 1, the inlet 108a may comprise showerhead (e.g., dual channel showerhead), faceplate, selective modulation devices, flow control devices, etc., which are usually present in a reactor. The reactor 100 may further comprise any other appropriate component that are usually present in a reactor.

In some embodiments, in addition to interacting with the microelectronic device 114, the etchant gases or radicals 107 may also interact with the inlet 108a, the chuck 108b, the inner surface 108c of the chamber 110, and/or any other component downstream of the generator 102. In general, any component in the reactor system 100, which is downstream of the plasma generator 102 and which can possibly interact with the radicals 107, are generally referred to as reactor chamber components 108 (or simply as components 108) in plural, and reactor chamber component 108 (or simply as component 108) in singular. For example, the components 108 may comprise one or more of the inlet 108a, the chuck 108b, the inner surface 108c of the chamber 110, a showerhead (e.g., a dual channel showerhead), a faceplate, a selective modulation device, flow control components (e.g., components that control flow of the radical plasma and gases in the reactor chamber), etc. of the reactor 100.

In some embodiments, the components 108 may comprise metals (e.g., stainless steel, aluminum, nickel, titanium, etc.), ceramics (e.g., Aluminum oxide (Al2O3), Yttrium oxide (Y2O3), etc.), amorphous oxides (e.g., fused quartz), etc. In some embodiments, a surface of a component 108 that comes in contact with the radicals 107 may be coated with non-reactive coating (e.g., aluminum coated with ceramics). Such coated surface may or may not react with the radicals 107.

In some embodiments, some of the surfaces of one or more of the components 108 may not have such coating, and may be reactive with some certain gasses or radicals 107. In some embodiments, some of the surfaces of one or more of the components 108 may have such coating, and may still be reactive with some certain gasses or radicals 107.

For example, bare metal (e.g., Aluminum, without coating) may be used for such surfaces and may be highly reactive with certain gasses or radicals 107. In an example, difficulty in coating the surface, after assembling the component 108, may be a reason behind not coating the surface of the component 108. In another example, the coating used on the material may be at least in part reactive (e.g., although may have some other tangible benefit over a non-coated surface). For the purposes of this disclosure, the components 108 may represent the reactor chamber components that are not coated and/or components that are coated, and that may interact with the gasses or radicals 107. Put differently, the components 108 may represent the reactor chamber components (e.g., which are downstream to the generator 102) that have surfaces that may interact with the radicals 107 (e.g., either uncoated bare metal surfaces, or coated surfaces). For example, the components 108 may represent the reactor chamber components comprising metal (e.g., bulk Aluminum) that may come in contact with, and may interact with, the gases and radicals 107. In some other example, the components 108 may represent the reactor chamber components comprising metal coated with partially non-reactive coating, which may come in contact with, and may interact with, the gases and radicals 107. Interacting with the radicals 107 may include reacting with the radicals 107, absorbing some of the radicals 107, etc.

As highly reactive gasses and radicals 107 are introduced into the reactor 100, the concentrations of the reacting species may be at least in part depleted by chemical interactions with the surfaces of the components 108. This environmental interaction may destabilize reaction etch rates intended for the microelectronic device 114 being processed. An ideal state, for example, may be an environment of the reactor 100 that does not influence the reaction rates throughout the life of the reactor 100, but this is not always an achievable solution. For example, the bare non-coated (or coated but still reactive) surfaces of the components 108 of the reactor 100 may interact with process gasses and radicals 107. This reaction may result in formation, accumulation, buildup, or gettering on the surfaces on these components 108.

FIG. 1 also illustrates a magnified view of a surface 150a of an example component 108, when the component 108 is newly installed in the reactor 100. As illustrated, the surface 150a may be rough, with the roughness of the surface 150a of the component 108 illustrated using rectangles for illustrative purposes only (the actual surface roughness may not have the shape illustrated in FIG. 1). As the surfaces 150a is not fully plain, the interaction rate of the gases and radicals 107 with the component 108 may be based on a roughness or total surface area of the surface 150a. For example, the more rough or uneven is the surface 150a, the more is the surface area of the surface 150a, and the more is the area available for interaction with the gases and radicals 107, and vice versa.

Over time, the surface 150a of the components may have getters or other byproducts formed thereon, thereby changing the surface roughness and surface area of the component, and/or changing its reactivity. This may necessitate cleaning of the surface 150a. For example, the component 108 may be removed from the reactor 100, and cleaned and polished. The surface 150b of FIG. 1 illustrates the surface of the component 108 after cleaning. As the surface 150b is after cleaning and polishing, the surface 150b may be relatively smooth, as symbolically illustrated in FIG. 1 by not having any roughness in the surface 150b.

Note that the surfaces 150a and 150b represent the same surface of the component 108—the surface 150a is representative of a new condition of the component 108, and the surface 150b is representative of the surface after cleaning and polishing.

The surface area of the surface 150b has less surface area relative to the surface 150a. Thus, the interaction rate of the surface 150b with the gases and radicals 107 is less than the interaction rate of the surface 150a with the gases and radicals 107. Thus, after cleaning, the component 108 with the relatively smooth surface may interact relatively less with gases and radicals 107 than the component 108 at the new condition. However, the reactor 100 may have been calibrated and fine-tuned for the new condition of the component 108, and cleaning of the component 108 may alter the etch rate of the microelectronic device 114. Thus, it may not be desirable to use the surface 150b of the component 108 in the reactor 100.

The surface 150c of FIG. 1 illustrates the surface of the component 108 after cleaning and treating the component 108. For example, the cleaning process adapted to form the surface 150b may be different from the cleaning process adapted to form the surface 150c. In some embodiments, the component 108 may be cleaned and the surface may be treated to form the surface 150c, where the surface may be at least in part morphologically similar to the surface 150a. For example, comparing the surfaces 150a and 150c, both surfaces may have abrasions or roughness—these abrasions or roughness are not necessarily in the same spots in the two surfaces, and shapes and sizes of these abrasions or roughness are not necessarily the same in the two surfaces 150a, 150c. However, in some embodiments, the two surfaces 150a and 150c have substantially similar surface areas. For example, the surface area of the surface 150c is within a threshold range of the surface area of the surface 150a (e.g., within ±10%, ±20%, ±25%, or the like). As the two surfaces 150a and 150c have substantially similar surface areas, the two surfaces 150a, 150c may have substantially similar interaction rate with the gases and radicals 107. Thus, even after cleaning and treating the component 108, the component 108 with the surface area 150c may have substantially similar interaction rate with the gases and radicals 107, e.g., compared to the interaction rate of the new component 108 with surface area 150a with the gases and radicals 107. Accordingly, the aging of the component 108, and subsequent refurbishment (e.g., cleaning and treatment) of the component 108 may not have any substantial effect on the etch rate of the target microelectronic devices.

Thus, if no control is placed on the microscopic morphology of the surface of the components 108 (e.g., either in newly made chamber components, or in components which are removed for preventative maintenance and refurbished using industry standard methods), the morphologies of these surfaces can vary beyond a threshold tolerance limit (e.g., the surfaces 150a and 150b may vary drastically). This changes the surface area available for reactions (e.g., the surface areas of the surfaces 150a and 150b are different) and, in turn, may result in an unpredictable etch rate, which may not be corrected for. In contrast, controlling the treatment of the surface of the component 108, as discussed herein in this disclosure, may result in the surface of the cleaned and treated component 108 to be substantially similar to the surface of the new condition of the component 108. For example, an aggregate degree of roughness in the surfaces 150a and 150b may be somewhat similar. This, to an extent, does not change the surface area available for reactions (e.g., the surface areas of the surfaces 150a and 150c may be substantially similar) and, in turn, may not impact the etch rate of the target devices.

Figure 2A:
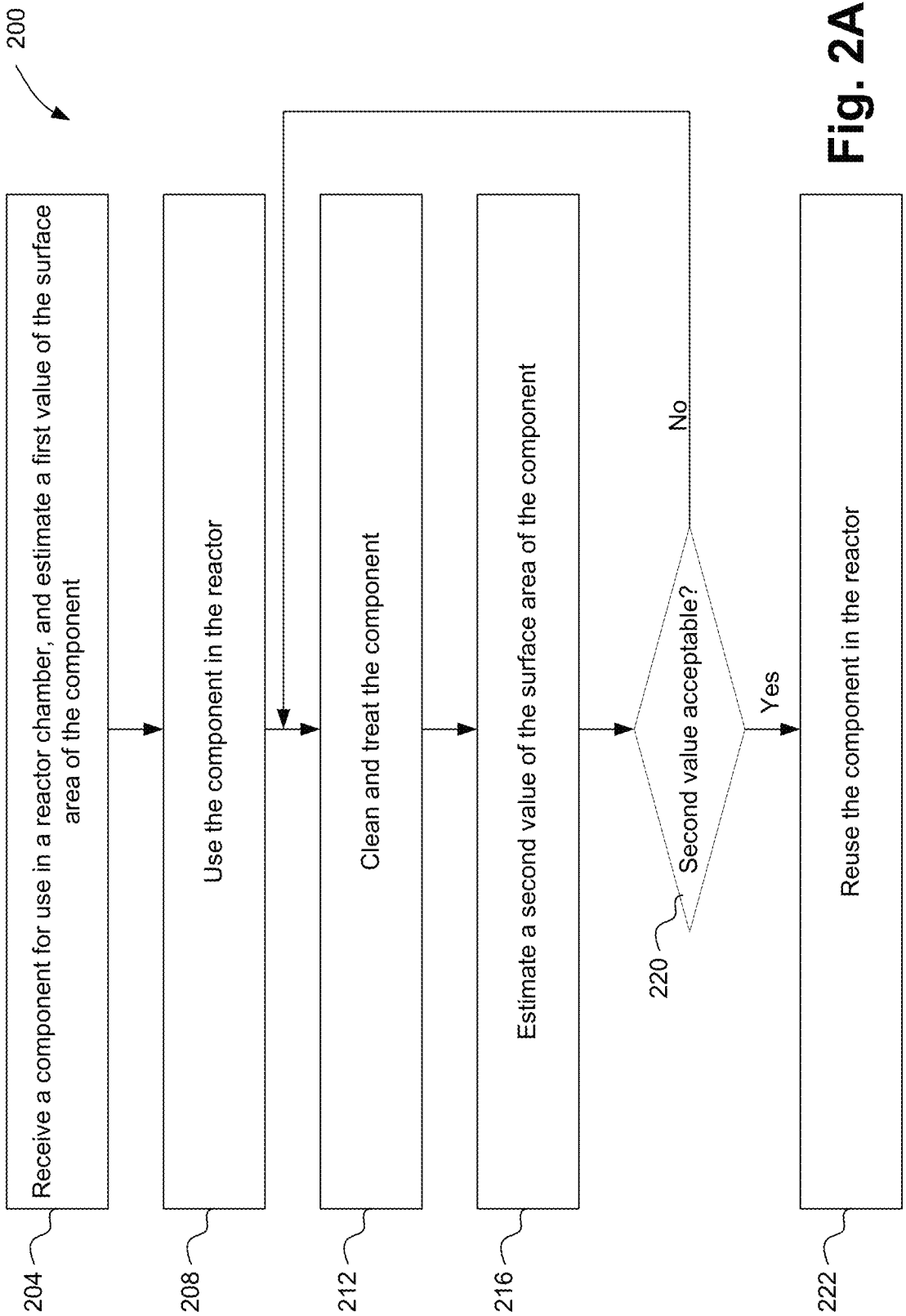
FIG. 2A illustrates a flowchart depicting a method for controlling cleaning and treatment of a reactor chamber component to morphologically match (i) the surface area of the component after the cleaning and treatment and (ii) a prior condition of the surface area of the component, according to some embodiments.
Figure 2B:
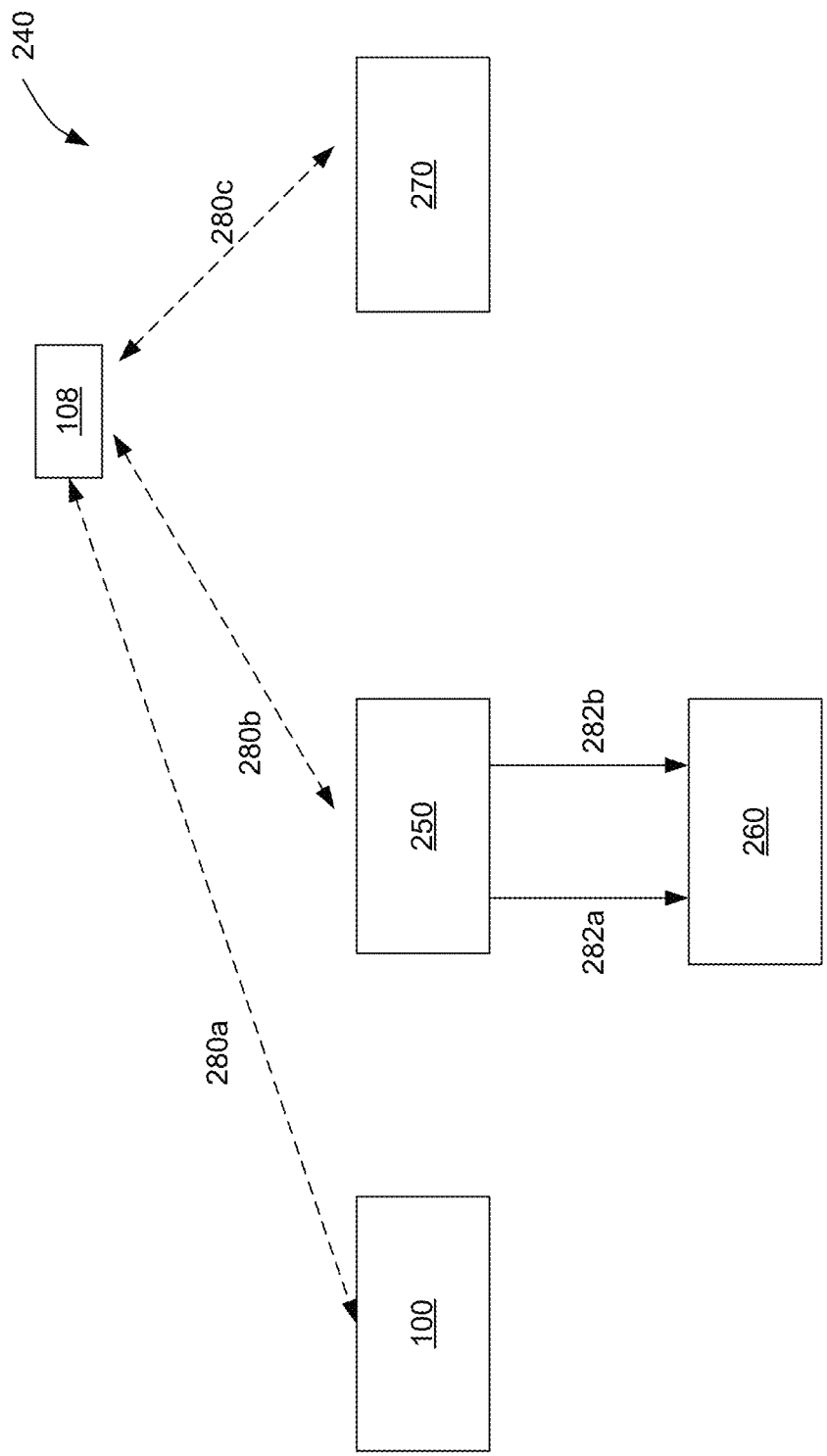
FIG. 2B illustrates an example implementation of a system to at least in part implement the method of FIG. 2A, according to some embodiments.

FIG. 2A illustrates a flowchart depicting a method 200 for controlling cleaning and treatment of a reactor chamber component (e.g., the component 108) to morphologically match (i) the surface area of the component after the cleaning and treatment and (ii) a prior condition of the surface area of the component, according to some embodiments. FIG. 2B illustrates an example implementation of a system 240 to at least in part implement the method 200, according to some embodiments. Although the blocks in the flowchart with reference to FIG. 2A are shown in a particular order, the order of the actions can be modified. Thus, the illustrated embodiments can be performed in a different order, and some actions/blocks may be performed in parallel. Some of the blocks and/or operations listed in FIG. 2A may be optional in accordance with certain embodiments. The numbering of the blocks presented is for the sake of clarity and is not intended to prescribe an order of operations in which the various blocks must occur.

Referring to FIG. 2B, symbolically illustrated are the reactor 100 and the component 108. As discussed, the component 108 may be used and reused in the reactor 100, which is symbolically illustrated using the dotted arrow 280a. Also illustrated is a laser scanning microscope 250, which may be used to estimate surface areas of at least a section of the component 108 (symbolically illustrated using the dotted arrow 280b). In some embodiments, the laser scanning microscope 250 may output estimates of surface areas of the component 108 to a computing device 260. For example, a first value 282a and a second value 282b (e.g., as discussed herein later with respect to blocks 204 and 216 of the method 200) of estimates of surface areas of the component 108 may be provided by the laser scanning microscope 250 to the computing device 260. Also illustrated is a treatment arrangement 270 for cleaning and treating the component 108 (symbolically illustrated using the dotted arrow 280c).

Referring now to FIG. 2A, at 204 of the method 200, a component 108 is received for use in a reactor chamber (e.g., the reactor 100 of FIG. 1). The component 108 may be a new component (e.g., has not been in prolonged use in a reactor chamber), or may have been previously used in a reaction chamber. Also, at 204, a first value of the surface area of the component may be estimated.

The estimation of the surface area of the component may be performed using, for example, a laser scanning microscope (e.g., the laser scanning microscope 250 of FIG. 2A). In an example, a laser scanning microscope from KEYENCE® may be used, although any other laser scanning microscope may also be used. A laser scanning microscope (also referred to as laser microscope) may generate high-resolution optical images and/or surface shape characterization. For example, the laser microscope may combine the advantages of a magnified observation device and a measurement device, in order to obtain both full-focus images and reliable 3D shape analysis. Thus, the laser microscope may produce a magnified image of the surface of the component 108, as well as measure one or more parameters (e.g., surface area, roughness, depth of abrasions or pores, etc.) of the surface of the component. The laser microscope may magnify images by 1000 times, 2000 times, 3000 times, 4000 times, or even higher.

In some embodiments, the first value of the surface area at 204 may be based on a magnifying factor used for the laser microscope. For example, at a relatively higher magnifying factor (e.g., with a magnification of about 3000 times), the laser microscope may be able to view and measure higher degree of surface roughness, as a result of which the estimated surface area may change (e.g., increase), and vice versa. Thus, in an example, the estimation at 204 and 216 of the method 200 may be performed using a same magnifying factor of the laser microscope. In an example, a higher magnifying factor used for the laser microscope may increase a reliability of measurements, but may correspondingly increase the time and complexity of the measurements.

At 208 of the method 200, the component 108 may be used in the reactor 100. The component may be used for a prolonged time (e.g., few minutes, few hours, few days, few weeks, or few months) in the reactor 100, e.g., until there is sufficient buildup of getters or other byproducts in the surface of the component 108 that necessitates cleaning and refurbishing the component 108.

For example, if at least a section of the surface of the component 108 comprises Aluminum, then over time Aluminum Fluoride (AlF) may be formed (e.g., by reaction between the bulk Aluminum of the component 108 and radicalized Ammonium Fluoride etch gas 107) over the surface of the component. Due to the buildup in the surface of the component 108, the component 108 may have to be refurbished, e.g., which may involve removing the component 108 from the reactor 100, and cleaning and treating the surface to get rid of the buildup.

At 212, the component 108 may be removed from the reactor 100 for controlled cleaning and treating the surface (e.g., by the treatment arrangement 270 of FIG. 2A). Various operations may be performed for cleaning and treating the component 108. The cleaning at 212 may remove the buildup formed on the surface of the component 108. Removing the buildup may involve polishing the surface to strip off thick film deposits of buildup (e.g., which may be Aluminum Fluoride formed by the reaction between the bulk Aluminum of the component and radicalized Ammonium Fluoride etch gas). Furthermore, aqueous cleaning process (e.g., possibly accompanied by ultrasound in an ultrasound bath) may be utilized to clean any remaining deposits after the polishing step. Any other cleaning process (e.g., aqueous cleaning process accompanied by ultrasound in an ultrasound bath) may also be involved to remove the buildup.

However, removing the buildup using polishing, aqueous cleaning, etc. may also have an impact on the surface morphology of the component 108. For example, polishing may cause mechanical deformation of the underlying metal (e.g., Aluminum) of the surface of the component 108 below the buildup (e.g., below the AlF layer).

Also, for example, the aqueous cleaning may change the surface morphology. For example, an aluminum "pickle" process may be used to remove the buildup (e.g., which may use a low pH acid to remove AlF), which may also affect the underlying metal (Aluminum), by pitting the surface of the component 108. However, as discussed herein previously, any substantial change to the surface morphology (e.g., relative to the surface morphology when the component is new) may also correspondingly change the total surface area available for reaction with the radicalized etch gas, which may affect the etch rate of the target microelectronic devices.

Accordingly, the controlled cleaning and treating at 212 of the method 200 may have two goals—(i) remove the buildup of getters or other byproducts from the surface of the component 108 and clean the component 108, and (ii) morphologically alter the surface of the component 108 such that the surface area of the component 108 after the treatment may substantially morphologically match with the surface prior to the use of the component in the reactor 100.

Removing the build-ups and debris from the surface of the component 108 may be achieved by one or more of cleaning the surface with an appropriate solvent, use of an ultrasound bath for cleaning (e.g., where ultrasound waves are used, in addition to a solvent, to clean the surface), polishing the surface, etc. Altering the surface of the component 108 may require some fine tuning and one or more iterations to ensure substantial match (e.g., such that the surface area of the component 108 after the treatment may substantially morphologically match with the surface prior to the use of the component in the reactor 100).

In an example, to achieve a surface match, the surface of the component 108 may be textured or polished (e.g., using a specific polishing pad and/or grit material, and possibly in a specific pattern) to generate a reproducible surface morphology (e.g., to ensure match with the surface morphology of the original state). Thus, in an example, the material, time, technique, equipment used, and/or the pattern used for polishing may be controlled to control the morphology of the surface, which may help in the surface matching.

In another example, to achieve the surface match and to remove the byproducts from the surface, aqueous cleaning steps (e.g., designed to strip reaction byproducts not removed by the polishing) may be designed with specific dilution, formulation, and/or residence time. Controlling the specific dilution, formulation, and/or residence time of aqueous cleaning may control chemical reactions (e.g., micropitting, etc.) of the cleaning solution with the surface of the component 108, which further alter the surface morphology of the surface of the component, to result in the above discussed matching of the treated surface and the original surface. For example, pickling is a metal surface treatment used to remove impurities and buildups (e.g., buildup of AlF), in which a solution called pickle liquor (e.g., which usually contains acid) is used to remove the surface impurities. The contents and/or pH level of the pickle liquor, duration of exposure of the surface of the component 108 to the pickle liquor, etc. may be controlled to control the surface morphology of the surface of the component, e.g., to aid in the above discussed matching.

In some embodiments, at 216 of the method 200, the surface area of the treated component 108 may be estimated (e.g., using the same laser microscope and using the same magnification as used in the operations at 208). For example, the surface area of the treated component 108 may be estimated to have a second value.

In some embodiments, at 220, it may be determined if the second value is acceptable. For example, the second value may be compared with the first value (e.g., by the computing device 260 of FIG. 2A). If the second value is within a threshold range of the first value (e.g., within ±10%, ±20%, ±25%, or the like), then the second value may be acceptable. If the second value is not acceptable, the treatment at 212 and the estimation at 216 may be iteratively repeated.

For example, if the second value (e.g., the surface area after treatment) is less than the first value (e.g., the surface area before use), then the surface of the component 108 after treatment is smoother than the surface prior to the use of the component in the reactor. In such a case, the treatment at 212 may be repeated to make the surface rougher (e.g., the treatment may be used to add abrasions and micropitting in at least some sections of the surface).

On the other hand, if the second value (e.g., the surface area after treatment) is more than the first value (e.g., the surface area before use), then the surface of the component 108 after treatment is rougher than the surface prior to the use of the component in the reactor. In such a case, the treatment at 212 may be repeated to make the surface smoother rougher (e.g., the treatment may be used to polish at least some sections of the surface to make it smoother).

After one or more iterations of the operations at 212, 216, and 220, if the second value of acceptable (e.g., if "Yes" at 220), then at 222, the component 108 may be reused in the reactor 100.

Figure 3:
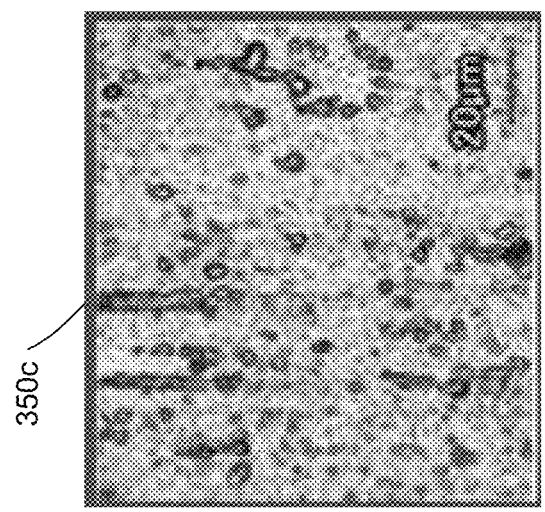
FIG. 3 illustrates magnified views of a section of a surface of a reactor chamber component, according to some embodiments.
Figure 3:
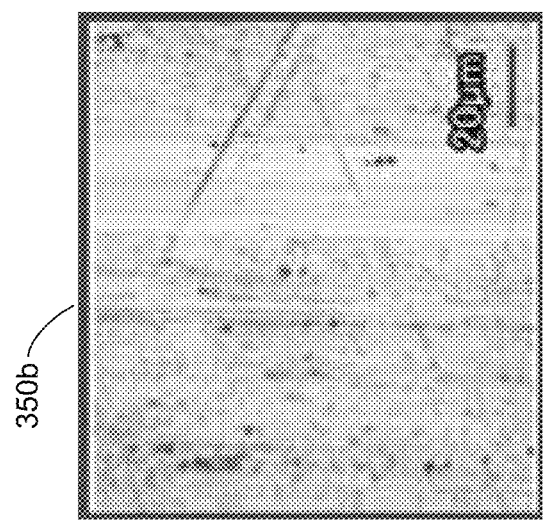
Figure 3:
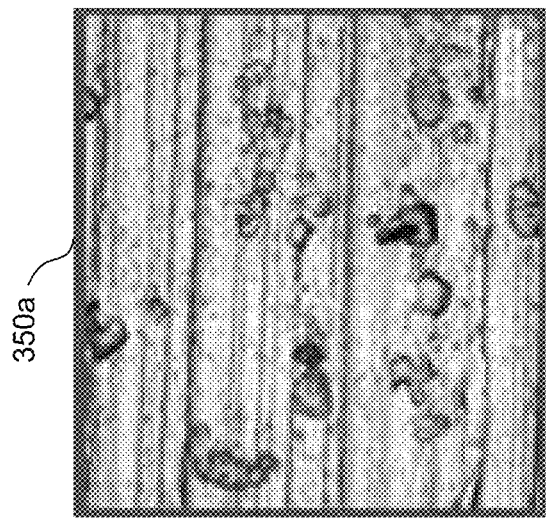

FIG. 3 illustrates magnified views of a section of the surface of the component 108, according to some embodiments. Illustrated in FIG. 3 is the surface 350a, which corresponds to the surface 150a of FIG. 1. The surface 350a is of the component 108 prior to the use of the component at 204 of the method 200. In an example, the surface 350a is of the component 108 when the component 108 is substantially new (e.g., has not been in prolonged use in a reactor). Thus, a surface area of the surface 350a may corresponding to the first value discussed with respect to 204 of method 200.

Also illustrated in FIG. 3 is a surface 350b, which may correspond to the surface 150b of FIG. 1. The surface 350b may be a result of cleaning and/or polishing of the component 108. As illustrated, the surface 350a has roughness and abrasions, which are substantially removed due to the cleaning in the surface 350b. Thus, the surface 350b has relatively less surface area than the surface 350a. Accordingly, there is no morphological match of the surface areas of the surfaces 350a and 350b, and hence, in an example, the surface 350b may not be used in the reactor 100.

Also illustrated in FIG. 3 is a surface 350c, which may correspond to the surface 150c of FIG. 1. The surface 350c may be a result of treating the surface in accordance with operations at 212 of the method 200. As illustrated, the surface 350a has roughness and abrasions, which may be at least in part intentionally generated as a part of the treatment at 212 of the method 200. A surface area of the surface 350c may corresponding to the second value discussed with respect to 216 of method 200.

In some embodiments, although the locations, shapes, and/or sizes of the abrasions and surface roughness of the surfaces 350a and 350b may not exactly or substantially match, the surface areas of the surfaces 350a and 350b may substantially match. For example, an aggregate of the surface roughness of the surfaces 350a and 350b may substantially match. Accordingly, the component 108 with the surface 350c may be reused in the reactor 100, e.g., as discussed with respect to operations at 220 and 222 of the method 200 (e.g., the surface 350c may result in "Yes" at 220). Thus, in an example, the surface morphology of the cleaned and treated surface 350c may substantially match the morphology of the surface 350a of the component 108 in the new condition, thereby ensuring substantially matched etch rate performance between the new component 108 and the component 108 after refurbishment (e.g., after cleaning and treating). This may result in reuse of the component 108 multiple times, where any refurbishment of the component 108 may not affect the etch rate of the target microelectronic devices within the reactor.

Also, reusing the component 108 via refurbishment (e.g., instead of repeatedly buying new components) may reduce wafer start costs. For example, the refurbishment cost may be lower than buying new component. This may also improve supply line stability, as new components may not be readily available (e.g., less reliance on outside supplier for supplying the new component, and cleaning and refurbishing the component may be within the control of the reactor operator). Refurbishing and reusing the component 108 repeatedly (e.g., instead of buying new components) has several other advantages, e.g., helping the environment, as it may take less energy to clean a component compared to mining and manufacturing the materials to make a new component. Reusing the component 108 via refurbishment (e.g., instead of repeatedly buying new components) may also improve the quality of processes performed in the dry etch chamber 100. Reuse and refinishing of component 108 could, potentially, offer tighter control of surface area (e.g., based on the controlled surface area treatment described herein), resulting in tighter control of processes ongoing in the dry etch chamber 100, as compared to the control resultant from repeatedly buying new components.

Figure 4:
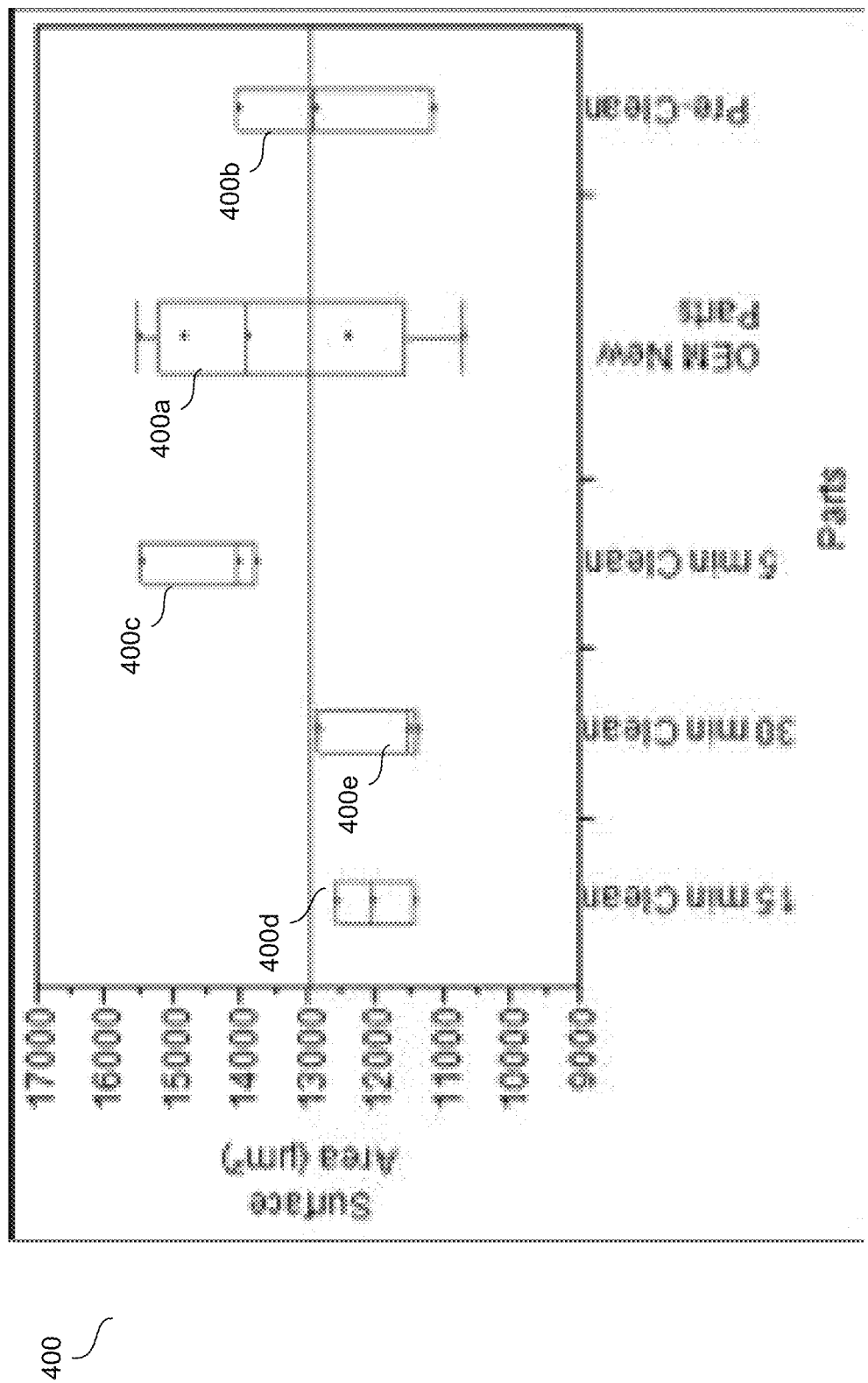
FIG. 4 illustrates a graph depicting changes in surface area of a surface of a reactor chamber component as the surface is treated, according to some embodiments.

FIG. 4 illustrates a graph 400 depicting changes in the surface area of the surface of the component 108 of the reactor 100 as the surface is treated, according to some embodiments. The X axis of the graph 400 corresponds to the surface at various states, and the Y axis represents the surface area (SA) of a section of the surface in micron square.

The graph 400 is a box graph. The box 400a corresponds to the SA of a new condition of the component 108. Multiple measurements of the surface are performed using a laser microscope, and the boxes are the statistical representation of the measurements. For example, in a box graph, whiskers at the top and bottom are represented by the $5^{th}$ and $95^{th}$ percentiles, the top and bottom horizontal sides of a rectangular box represent $25^{th}$ and $75^{th}$ percentiles. The line in the middle represent a mean value of the measurements. As seen, the mean value of SA for the section of the surface of the component 108 in the new condition is about 14000 $\mu m^2$.

Box 400b represent the surface after use, and before treatment and cleaning. The mean value of SA for the section of the surface of the component 108 after use, and before treatment and cleaning is about 13000 $\mu m^2$.

Boxes 400c, 400d, and 400e represent the surface after 5 minutes of cleaning, 15 minutes of cleaning, and 30 minutes of cleaning, respectively. As seen, the mean value of SA for the section of the surface of the component 108 after about 5 minutes of cleaning most closely match with the mean value of SA for the new component. Thus, for the given cleaning solution concentration, 5 minutes of cleaning may be appropriate. Once this is determined, for all subsequent components, 5 minutes of cleaning may suffice. Thus, in this example, the first value in 204 of the method 200 may correspond to the mean value of the box 400a, and the second value in 216 of the method 200 may correspond to the mean value of the box 400c. As the two values substantially match, after 5 minutes of cleaning, the second value may be deemed acceptable and the component may be reused.

Figure 5:
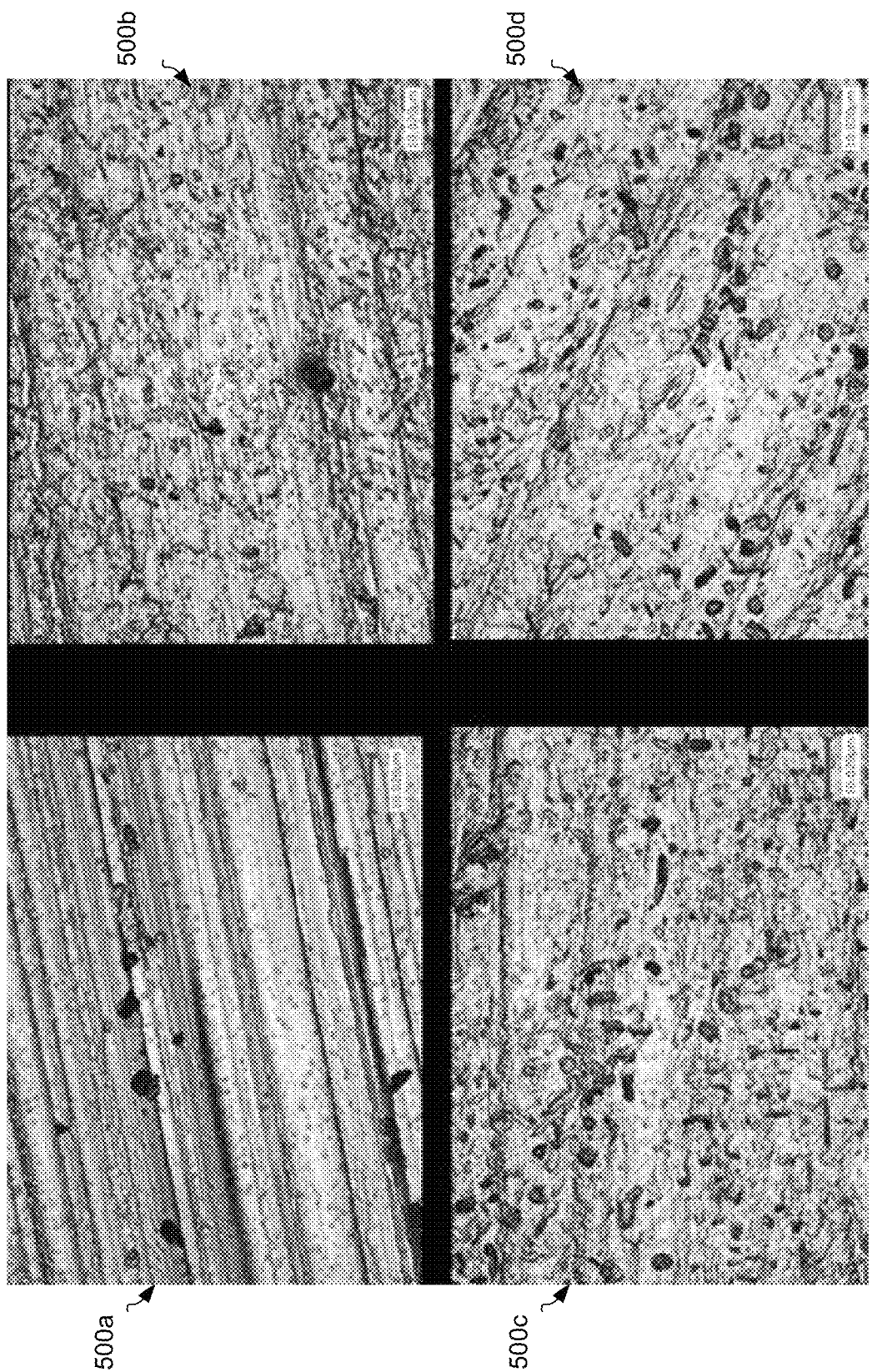
FIG. 5 illustrates an effect of cleaning and treatment on a surface area of a surface of a reactor chamber component, according to some embodiments.

FIG. 5 illustrates an effect of cleaning and treatment on the surface of the component 108 of the reactor 100, according to some embodiments. In FIG. 5, illustrated as 500a is a section of the surface of the component 108 in new condition. Also illustrated as 500b is the section of the surface of the component 108 after use, but prior to cleaning and treatment. Also illustrated as 500c is the section of the surface of the component 108 after a first time-duration of cleaning, where in an example, the first duration is about 15 minutes. Also illustrated as 500d is the section of the surface of the component 108 after a second time-duration of cleaning, where in an example, the second duration is about 30 minutes. As seen, the surface roughness (and hence, surface area) of the component changes from its original new condition to a pre-clean condition. Also, the surface roughness (and hence, surface area) of the component changes with a change in the duration of cleaning. If, for example, the laser microscope determines that the surface area of the surface 500d substantially matches with the surface area of the surface 500a, then the component may be cleaned for the second time-duration and then reused in the reactor 100.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A plasma etch process reactor component comprising a metal, wherein:
   a surface of the metal comprises aluminum and is substantially free of fluorine;
   a morphology of the surface comprises more micropits than abrasion grooves; and
   individual ones of the abrasion grooves have a first length at least ten times longer than a first width, and individual ones of the micropits have a diameter that is larger than the first width.

2. The plasma etch process reactor component of claim 1 wherein the surface of the metal comprises bare, uncoated bulk aluminum.

3. The plasma etch process reactor component of claim 1, wherein the micropits have diameter of greater than 1 µm in diameter.

4. The plasma etch process reactor component of claim 3, wherein the first width is less than 2 µm.

5. The plasma etch process reactor component of claim 1, wherein the surface has a mean surface area of greater than 13000 µm$^2$.

6. The plasma etch process reactor component of claim 1, wherein the surface of the component has more than 50 micropits of greater than 1 µm in diameter within a sample area of at least 6,500 µm$^2$.

7. The plasma etch process reactor component of claim 1, wherein the surface has fewer than ten abrasion grooves of at least 40 µm in length and less than 1 µm in width.

8. The plasma etch process reactor component of claim 1, wherein the component is one of a chuck, or a showerhead.

9. The plasma etch process reactor component of claim 8, wherein the component is a showerhead.

10. A plasma etch process reactor, the reactor comprising:
    a plasma generator to generate a plasma of an etchant gas within the reactor, wherein the etchant gas comprises fluorine;
    a chuck to support a workpiece exposed to the plasma, wherein the workpiece comprises a semiconductor wafer; and
    a component within the reactor, wherein a surface of the component to be exposed to the plasma comprises aluminum and a morphology of the surface comprises more micropits than abrasion grooves, and individual ones of the abrasion grooves have a first length at least ten times longer than a first width, and individual ones of the micropits have a diameter that is larger than the first width.

11. The plasma etch process reactor of claim 10, wherein the component is a showerhead of the plasma etch process reactor.

12. The plasma etch process reactor of claim 11, wherein the surface has fewer than ten abrasion grooves of at least 40 µm in length and less than 1 µm in width.

13. The plasma etch process reactor of claim 12, wherein the surface has a mean surface area of greater than 13000 µm$^2$.

14. The plasma etch process reactor of claim 13, wherein the surface of the component has more than 50 micropits of greater than 1 µm in diameter within a sample area of at least 6,500 µm$^2$.

15. The plasma etch process reactor of claim 14, wherein the surface of the component comprises bare, uncoated bulk aluminum.

16. The plasma etch process reactor of claim 15, wherein the micropits have diameter of greater than 1 µm in diameter.

17. The plasma etch process reactor of claim 16, wherein the first width is less than 2 µm.

18. A plasma etch process reactor showerhead comprising uncoated bulk aluminum, wherein: a surface of the aluminum is substantially free of fluorine and has a mean surface area of greater than 13000 µm$^2$; a morphology of the surface comprises more micropits than abrasion grooves; and individual ones of the abrasion grooves have a first length at least ten times longer than a first width, and individual ones of the micropits have a diameter that is larger than the first width.

19. The plasma etch process reactor showerhead of claim 18, wherein the micropits have diameter of greater than 1 µm in diameter, and wherein the first width is less than 2 µm.

20. The plasma etch process reactor showerhead of claim 19, wherein the surface of the aluminum has more than 50 micropits of greater than 1 µm in diameter within a sample area of at least 6,500 µm$^2$, and wherein the surface has fewer than ten abrasion grooves of at least 40 µm in length and less than 1 µm in width.

* * * * *